United States Patent [19]

Takahashi et al.

[11] 4,202,696
[45] May 13, 1980

[54] METHOD OF REMOVING SURFACE TACK OF CURED FREE RADICAL POLYMERIZED RESIN COMPOSITION USING ORGANIC CARBONYL COMPOUND

[75] Inventors: Gensho Takahashi; Kazuhito Miyoshi; Yoneharu Tanaka, all of Fuji, Japan

[73] Assignee: Asahi Kasei Kogyo Kabushiki Kaisha, Osaka, Japan

[21] Appl. No.: 906,890

[22] Filed: May 16, 1978

[30] Foreign Application Priority Data

May 23, 1977 [JP] Japan ................................ 52-58799

[51] Int. Cl.² ............................................. G03C 1/68
[52] U.S. Cl. ................................. 430/306; 430/432; 430/644
[58] Field of Search ....................... 252/8.3; 134/1, 26, 134/42; 96/35.1, 119 R, 48 R; 101/456

[56] References Cited

U.S. PATENT DOCUMENTS

| | | | |
|---|---|---|---|
| 3,861,911 | 1/1975 | Luebbe | 96/35.1 |
| 3,865,597 | 2/1975 | Broyde | 96/35.1 |
| 3,997,344 | 12/1976 | Schlesinger | 96/86 P |

FOREIGN PATENT DOCUMENTS 50-2070  1/1975  Japan .

*Primary Examiner*—John D. Welsh
*Attorney, Agent, or Firm*—Sprung, Felfe, Horn, Lynch & Kramer

[57] ABSTRACT

A novel method of removing surface tack of a cured free radical polymerized resin composition which comprises impregnating the surface layer of the cured free radical polymerized resin composition with a specific organic carbonyl compound and irradiating the impregnated layer of the cured resin composition with specific actinic rays. The method of the present invention is applicable for effectively removing surface tack of cured photopolymerized or heat-polymerized resin compositions, especially photopolymer type printing plates manufactured therefrom.

8 Claims, No Drawings

METHOD OF REMOVING SURFACE TACK OF CURED FREE RADICAL POLYMERIZED RESIN COMPOSITION USING ORGANIC CARBONYL COMPOUND

This invention relates to a method of removing surface tack of a cured free radical polymerized resin composition, and more particularly to an improved method of removing surface tack of a cured free radical polymerized resin composition, characterized by treating the cured resin composition with a specific organic carbonyl compound, followed by irradiation with actinic rays.

In general, resin compositions polymerized and cured by exposure to actinic radiation and resin compositions polymerized and cured by heating still more or less have stickiness or surface tack because some of the materials remain unreacted even after curing. This surface tack is not desired for storage, handling and practical use of cured products.

It is therefore one and a principal object of this invention to provide a novel method of effectively removing surface tack of a cured free radial polymerized resin composition.

The method of this invention can be effectively applied to all kinds of cured free radial polymerized resin compositions having surface tack. The method of this invention is particularly suitable for removing surface tack of cured photopolymerized resin compositions, especially those to be used as a photopolymer type printing plate.

Also, in the case of resin compositions thermally polymerized and cured, surface tack can be removed according to the method of this invention, as in the case of cured photopolymerized resin compositions. However, this invention will be described mainly in reference to photosensitive resin compositions.

The term "cured photopolymerized resin composition" as used herein is intended to mean a resin composition which has been cured and insolubilized by exposing a photosensitive resin composition to actinic radiation. Such a cured photopolymerized resin composition will hereinafter be often referred to as "photocured product."

In the field of printing, especially letterpress printing, photorelief type printing plates have recently been used instead of the conventional zinc plates, lead plates, manually engraved rubber plates and cast rubber plates. With the development of such photorelief type printing plates in which photosensitive resin compositions are used as the materials of the printing plate, problems of contamination of working places and environmental pollution caused by the use of heavy metal plates have been considerably solved and complicatedness of steps inevitably necessary for the production of the conventional printing plates has been eliminated. However, surfaces of the photocured products are more or less tacky as described above, and hence, when the photocured products are used as a printing photorelief, this surface tack causes various troubles. Therefore, in the case of the photorelief type printing plates, removal of surface tack is an important task.

In general, the process for preparing photorelief type printing plates comprises at least four steps; namely, exposure, development, drying and post-exposure. However, a resin plate prepared by the process including only these four steps encounters difficulty in practical use under some printing conditions because the surface tack of the photocured layer is still high. More specifically, when a printing plate prepared only through the foregoing four steps is used for the printing operation, handling of the plate is difficult when it is attached to or dismounted from a printing cylinder, and when such printing plates are temporarily piled and stored, such troubles as adhesion of the printing plates to each other and adhesion of dusts to the printing plates are caused. Moreover, when a material to be printed is paper, troubles such as adhesion of paper dusts to the printing plate and peeling are caused. If adhesion of paper dusts and/or peeling is caused by the tack of the printing plate, the yield of prints is reduced and in addition since the printing operation must be interrupted to clean the printing plate by wiping, the operation efficiency is lowered.

As means of eliminating or diminishing these disadvantages, there have been proposed and adopted a method in which a coating material such as a rubber latex or a saran latex is applied onto the photorelief type printing plate to render the surface free from tack, a method in which the post-exposure of the photorelief type printing plate to actinic radiation is conducted in an inert gas or while dipping the plate in a liquid so that photopolymerization of the still photosensitive resin layer in its surface area is promoted, and a method in which the photorelief type printing plate is chemically treated with an oxidant and/or a reducing agent. Further, two or more of these methods are sometimes adopted in combination.

These known methods are still defective because in some cases the effect attainable is insufficient, and in some cases dangerous and/or poisonous chemicals must be used even if a sufficient effect can be attained. Illustratively stated, the coating method (i) is defective in that the coating layer tends to be peeled off while the printing operation is conducted and hence maintenance of the effect is insufficient. In the method (ii) in which post-exposure is carried out in an oxygen-free atmosphere such as in a liquid or in an inert gas, the surface tack-removing effect is often insufficient when some kinds of photosensitive resin compositions are employed for making photorelief type printing plates. The method (iii) in which an oxidant and/or a reducing agent is used is defective in that chemicals ordinarily used are, in general, dangerous and/or poisonous substances and the operation of preparing a treating solution and/or treating therewith the surface of the photorelief type printing plate is very dangerous. Furthermore, in the method (iii), a device and/or implements to be in contact with the treating solution must be subjected to a treatment for rust-prevention or anti-corrosion.

In the method (ii), the once-exposed resin composition is further free radical-polymerized by means of the polymerizable double bonds in the aforementioned manner to provide a high density three-dimensional structure and increase the mechanical strength, and simultaneously, by this radical polymerization, the amount present of an uncured (i.e., non-crosslinked) prepolymer is decreased as much as possible to reduce surface tack. In the case of a prepolymer having 2 or less polymerizable double bonds in the molecule, the increase of the mechanical strength can be observed by the method (ii), but the surface tack-removing effect is insufficient. Even in the case of a prepolymer having more than 2 polymerizable double bonds in the molecule, it takes a long time to attain a sufficient surface tack-removing effect by the method (ii). Therefore, in order to attain a sufficient surface tack-removing effect for a reasonable time in the case of photosensitive resin compositions comprising either of the above-mentioned two kinds of prepolymers, it is necessary to cure the prepolymers by a method other than the method in which polymerization by means of the polymerizable double bonds is utilized. In this connection, it is noted that in some cases the surface tack of a photorelief type printing plate post-exposed according to the method (ii) increases as the printing operation is continued.

The foregoing problems and defects of various countermeasures for solving these problems are similarly involved in cured products of other free radical polymerizable resin compositions such as heat polymerizable resin compositions.

Taking into consideration the problems involved in the conventional methods of removing surface tack, we made extensive and intensive investigations with a view to solving the problems caused by surface tack of cured products and developing a novel method of removing surface tack of cured free radical polymerized resin compositions. As a result, we found that when the surface layer of a cured free radical polymerized resin composition is treated with a specific organic carbonyl compound and then irradiated with actinic rays having specific wavelengths, the surface tack of the cured resin composition can be effectively removed. Based on this finding, we have now completed this invention.

More specifically, in accordance with this invention, there is provided a method of removing surface tack of a cured free radical polymerized resin composition which comprises impregnating the surface layer of the cured free radical polymerized resin composition with at least one organic carbonyl compound capable of abstracting a hydrogen atom out of other compound under irradiation with actinic rays and irradiating the impregnated layer of the cured resin composition with actinic rays having wavelengths of from 200 to 300 nm.

The method of the present invention is applicable to many kinds of free radical polymerizable resin compositions. As typical instances, there can be mentioned the following two kinds of resin compositions.

(1) A free radical polymerizable resin composition comprising a prepolymer having at least one polymerizable double bond in the molecule and as optional components a heat- or photopolymerization initiator, an ethylenically unsaturated monomer having at least one polymerizable double bond and a polymerization inhibitor as a stabilizer. For example, resin compositions comprising as a prepolymer at least one member selected from unsaturated polyester resins, unsaturated polyurethane resins, unsaturated polyamide resins, unsaturated polyacrylate resins, unsaturated polymethacrylate resins and modified products thereof can be mentioned. For instance, photosensitive resin compositions of this type are disclosed in Japanese Patent Application Laid-Open Specification No. 90304/1977, Japanese Patent Publication No. 19125/1968, Japanese Patent Application Laid-Open Specification No. 109104/1974 and Japanese Patent Publication No. 41708/1973, and heat-polymerizable resin compositions of this type are disclosed in Japanese Patent Publication No. 14805/1964, etc.

(2) A photopolymerizable rubber composition, i.e., a so-called photosensitive elastomer, comprising an uncured rubber, a monomer having at least one polymerizable double bond and a photopolymerization initiator. Compositions of this type are disclosed in, for example, Japanese Patent Application Laid-Open Specification No. 106501/1976, Japanese Patent Application Laid-Open Specification No. 37521/1972 and British Patent No. 1,366,769.

The method of this invention is different from the conventional curing method in which polymerization by means of polymerizable, ethylenically unsaturated double bonds in resin compositions is utilized or the conventional methods of removing surface tack by utilizing this polymerization, as described below. More specifically, in the method of this invention, in order to remove surface tack of the cured product in which the surface tack is a substantial problem, the surface layer of the cured product is impregnated with a specific organic carbonyl compound and then irradiated with actinic rays having wavelengths of from 200 to 300 nm to excite the organic carbonyl compound. The thus excited carbonyl compound abstracts hydrogen atoms out of a prepolymer in the photocured product or out of an uncured rubber to form free radicals in the prepolymer or the uncured rubber, and the so formed free radicals are coupled with other polymer radicals formed similarly. Therefore, by the method according to this invention, an uncured prepolymer that cannot be cured by the conventional means such as polymerization by means of polymerizable, ethylenically unsaturated double bonds can be effectively cured, whereby surface tack of the photocured product can be removed. Accordingly, the method of this invention can be conveniently utilized for the removal of surface tack of a photosensitive resin composition including a prepolymer having two or less polymerizable double bonds in the molecule. In the case of such a photosensitive resin composition, sufficient removal of surface tack can hardly be attained even by post-exposure in an oxygen-free atmosphere or a chemical treatment with the use of a heat polymerization initiator for promoting vinyl polymerization. Furthermore, according to this invention, as described above, the surface tack of a photocured product comprising a prepolymer which cannot be cured by radical polymerization by means of vinyl groups can be removed by utilizing hydrogen-abstracting photochemical reaction for curing molecules of the prepolymer present at least in the surface layer of the photocured product. Therefore, as different from the conventional method in which a coating layer is merely formed on the cured surface of the cured product, the method of this invention does not involve such a defect of the conventional coating method that the coating layer is peeled off during the printing operation. Although the treatment adopted in the method of this invention is a chemical treatment, is is different from the conventional chemical treatment as used for the removal of surface tack in which treatment an oxidant and/or a reducing agent having a high reactivity, which should be carefully handled, is used. The organic carbonyl compound that is used as a hydrogen-abstracting agent in this invention is not substantially subject to thermal reaction under temperature conditions as adopted for practicing the method of this invention unless it is irradiated with actinic rays. Therefore, the organic carbonyl compound can be handled very easily and safely.

The organic carbonyl compound that is used as the hydrogen-abstracting agent in this invention is an organic carbonyl compound having such a property that under irradiation with actinic rays, excited carbonyl oxygen atoms of the carbonyl compound are capable of abstracting hydrogen atoms out of other compounds. In this invention, there may be used organic carbonyl compounds whose reactivity in the hydrogen-abstracting reaction is as high as or higher than the reactivity of other reactions of the carbonyl group excited by irradiation with actinic rays, for example, Norrish reaction of the type I, namely the reaction in which a carbonyl compound is cleaved at the α-position under irradiation with actinic rays, or Norrish reaction of the type II, namely the reaction in which a ketone having at the α-position with respect to the carbonyl group a hydrogen atom to be abstracted is cleaved into an olefin and a smaller ketone under irradiation with actinic rays. As the organic carbonyl compound having such photochemical reactivity, there can be mentioned, for example, organic carbonyl compounds having at least one unsubstituted or substituted aryl group (single ring or condensed ring) bonded to the carbon atom of the carbonyl group and unsubstituted or substituted benzoquinones.

Of those compounds, preferred orgnic carbonyl compounds are those having at least one aryl group selected from a phenyl group and a naphthyl group which aryl group is bonded to the carbon atom of the carbonyl group and is unsubstituted or substituted with one phenyl group or with one or two members selected from halogen atoms, a hydroxyl group, a carboxyl group, a nitro group, straight chain or branched alkyl groups having 1 to 5 carbon atoms, and straight chain or branched alkoxyl groups having 1 to 5 carbon atoms.

Of the above-mentioned preferred organic carbonyl compounds, those having a structure represented by the following formula (I) or (II) are more preferred:

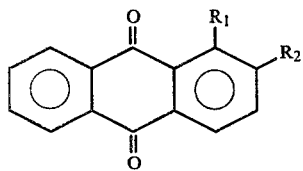
(I)

wherein $R_1$ and $R_2$, which may be the same or different, stand for a hydrogen atom, a nitro group, a carboxyl group, a straight chain or branched alkyl group having 1 to 5 carbon atoms or a halogen atom selected from F, Cl, Br and I,

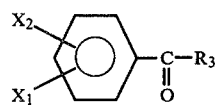
(II)

wherein $X_1$ and $X_2$, which may be the same or different, stand for a halogen atom selected from F, Cl, Br and I, a hydrogen atom, a nitro group, a straight chain or branched alkoxyl group having 1 to 5 carbon atoms, a hydroxyl group of a straight chain or branched alkyl group having 1 to 5 carbon atoms, and $R_3$ is a member selected from the group consisting of straight chain or branched alkyl groups having 1 to 5 carbon atoms, a naphthyl group, groups represented by the following formula:

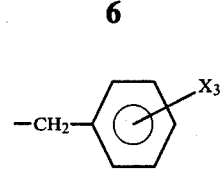

wherein $X_3$ stands for a halogen atom selected from F, Cl, Br and I, a hydrogen atom, a straight chain or branched alkyl group having 1 to 5 carbon atoms a straight chain or branched alkoxyl group having 1 to 5 carbon atoms or a phenyl group, groups represented by the following formula:

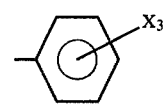

wherein $X_3$ is as defined above, and groups represented by the following formula:

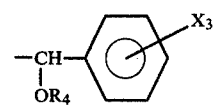

wherein $X_3$ is as defined above and $R_4$ is a hydrogen atom or a straight chain or branched alkyl group having 1 to 5 carbon atoms.

As specific examples of organic carbonyl compounds represented by the above formula (I) or (II), there can be mentioned unsubstituted or substituted benzophenones such as benzopehnone, 4-bromobenzophenone, 4,4'-dichlorobenzophenone, 4,4'-dimethoxybenzophenone, 4-methylbenzophenone, 4-hydroxybenzophenone, 3,5-dihydroxybenzophenone and 4-phenylbenzophenone; unsubstituted or substituted acetophenones such as acetophenone, 4-methylacetophenone, 3,5-dimethylacetophenone, 4-methoxyacetophenone, 2-chloroacetophenone, 4-chloroacetophenone, 2-chloro-3-nitroacetophenone, 2-chloro-5-nitroacetophenone, 2,6-dimethoxyacetophenone and 4-hydroxyacetophenone; unsubstituted or substituted aromatic ketones such as deoxybenzoin, phenyl naphthyl ketone, benzoin, benzoin methyl ether, benzoin ethyl ether, benzoin n-propyl ether, benzoin isopropyl ether, benzoin n-butyl ether, benzoin isobutyl ether, benzoin t-butyl ether and other alkyl ethers of benzoin; and various quinone compounds such as 9,10-anthraquinone, 2-bromo-9,10-anthraquinone, 1-nitro-2-carboxy-9,10-anthraquinone, 2-methyl-9,10-anthraquinone and 2-ethyl-9,10-anthraquinone.

As other specific examples of organic carbonyl compounds that can be used in this invention, there can be mentioned substituted acetophenones such as α-chloro-α-phenylacetophenone and α,α-dichloroacetophenone; various o- or p- quinone compounds such as p-benzoquinone, 2,5-dimethyl-p-benzoquinone, 2,6-dichloro-p-benzoquinone, 2-ethyl-5,6,7,8-tetrahydroanthraquinone, 1,4-naphthoquinone, 2,3-dichloronaphthoquinone, 2,3-dimethyl-1,4-naphthoquinone, 2-ethyl-1,4-naphthoquinone, phenanthraquinone and 1,2-naphthoquinone; and α-diketones such as benzil.

Particularly, organic carbonyl compounds having a higher n, π* character in the lowest excited state have a higher hydrogen-abstracting activity.

As the organic carbonyl compound that is particularly suitable in practicing the method of this invention, there can be mentioned, for example, benzophenone, 4,4'-dimethoxybenzophenone, 4-hydroxybenzophenone, deoxybenzoin, acetophenone, 2-chloroacetophenone, 4-methylacetophenone, 9,10-anthraquinone, 2-methyl-9,10-anthraquinone, 2-ethyl-9,10-anthraquinone and 2-bromo-9,10-anthraquinone.

The above-mentioned organic carbonyl compounds (hereinafter often referred to as "hydrogen-abstracting agent") may be used alone or in mixture.

The method for impregnating the surface layer of the cured product with the hydrogen-abstracting agent is not particularly critical. For example, there may be employed a method in which a treating solution formed by dissolving the hydrogen-abstracting agent in an appropriate solvent is coated on the surface of the cured product by brushing or spraying. Alternatively, there may be employed a method in which the cured product is dipped in the treating solution. Any solvent may be used so far as it can dissolve the hydrogen-abstracting agent. As such solvents, there can be mentioned, for example, alcohols, ketones, esters, aliphatic or aromatic hydrocarbons and mixture thereof. There may also be used a mixture of water with an alcohol or alcohols and/or acetone.

When the hydrogen-abstracting agent is used in the form of a solution, a satisfactory surface tack-removing effect can be obtained by adjusting the treating conditions even if the concentration of the hydrogen-abstracting agent is as low as 0.01 part by weight per 100 parts by weight of the solvent used, but in order to accomplish the impregnation treatment by one time dipping operation in a time as short as several seconds to about 10 minutes, it is preferred that the concentration of the hydrogen-abstracting agent be at least 0.1 part by weight per 100 parts by weight of the solvent. By the use of a solution of a concentration lower than 0.01 part by weight per 100 parts by weight of the solvent, there can be attained the intended effect to some extent, but the use of a treating solution having such a low concentration is not practically preferred because there is needed a long dipping time or many times repeated operations for attaining the sufficient surface tack-removing effect. When the surface layer of the cured product is impregnated with the hydrogen-abstracting agent, even if the thickness of the layer impregnated with the hydrogen-abstracting agent is very small, a tack-removing effect can be recognized. In general, a sufficient effect can be obtained even if the thickness of the hydrogen-abstracting agent-impregnated layer is as small as 1–5μ. The thickness of the hydrogen-abstracting agent-impregnated layer has no upper limit, but too large the thickness leads to swelling of the cured product and results in a long drying time. Accordingly, it is preferred that the thickness of the hydrogen-abstracting agent-impregnated layer be below 3% in terms of swelling to the original thickness of the cured product.

It is conceivable to adopt a method in which the hydrogen-abstracting agent is added, in advance, to a photosensitive resin composition instead of the above-mentioned impregnation method. However, if the hydrogen-abstracting agent is incorporated in an amount sufficient to attain a surface tack-removing effect, the sensitivity of the photosensitive resin composition is drastically deteriorated and sensitivity characteristics required of the photosensitive resin composition for a printing plate are damaged. Further, even when a composition containing the hydrogen-abstracting agent is applied to uses other than the use as a printing plate, for the same reason the time required for the molding operation is prolonged and hence the use of such a resin composition is not preferred from the practical viewpoint. Accordingly, in order to perform the exposure treatment at the photocuring step in the same manner as in the conventional methods and in order to remove surface tack of the photocured product, it is necessary to impregnate with the hydrogen-abstracting agent the surface layer of the cured product whose tack is not desired, after the molding and exposure steps.

Actinic rays to be employed to irradiate the cured product impregnated with the hydrogen-abstracting agent in the method of this invention must be ultraviolet rays having a wavelength distribution more or less in the region of short wavelengths of 300 nm or less; otherwise, no substantial surface tack-removing effect can be attained. However, in the case of actinic rays having shorter wavelengths of less than 200 nm, if irradiation is conducted in air, ozone tends to be formed and such unfavourable influences of the formed ozone as harmfulness to a human body and oxidative degradation of the cured product cannot be neglected. In this case, even if irradiation is conducted in an oxygen-free atmosphere, photodegradation of the cured product tends to be caused. Therefore, it is preferred to use actinic rays having wavelengths of 200 nm or more. Accordingly, in practicing the method of this invention, it is advantageous to irradiate the cured product with actinic rays having a relatively high intensity wavelength distribution in the region of from 200 to 300 nm. As sources of these actinic rays, there can be mentioned, for example, a low pressure mercury lamp, a high pressure mercury lamp, a germicidal lamp and a heavy hydrogen lamp. Actinic rays from these sources possess a wavelength distribution having relatively high intensity wavelengths in the region of 200 to 300 nm. Accordingly, when these sources are employed, a high effect can be attained by conducting irradiation even for a short time. Even if a small quantity of actinic rays of less than 200 nm is emitted from an actinic ray source, when the quantity is such that the degree of the above-mentioned ozone formation or photodegradation can be neglected, no problem is caused. Of course, even a source emitting actinic rays comprising wavelengths of 200 nm or less in a relatively larger proportion can be practically used if an appropriate wavelength filter or other means is used.

In this invention, the quantity of actinic rays to be irradiated onto, for example, the photocured product impregnated with the hydrogen-abstracting agent is required to be at least $2.4 \times 10^2$ mW·sec·cm$^{-2}$ (as measured by using Orc Ultraviolet Meter Model UV-202 manufactured and sold by Orc Manufacturing Co., Ltd., Japan), though an appropriate quantity of actinic rays may be varied according to the kind of the photocured product. In general, a sufficient surface tack-removing effect can be attained when the quantity of actinic rays is $4.8 \times 10^2$ to $4.5 \times 10^3$ mW·sec·cm$^{-2}$. Accordingly, the necessary irradiation time is determined from the intensity of the actinic ray source to be used, taking into consideration the required quantity of actinic rays as mentioned above. From the practical viewpoint, it is preferred that the irradiation time be set within 1 to 30 minutes by selecting an appropriate actinic ray source and adjusting the intensity of actinic rays at the position where the photocured product is irradiated. In the case of the production of printing plates, from the viewpoint of the time balance with other steps, it is more preferred that the irradiation time be set within 3 to 15 minutes by adjusting the intensity of the actinic ray source and the intensity of actinic rays at the irradiation position.

In practicing the method of the present invention, irradiation is generally carried out in air, but, according to need, it may be carried out in an inert gas or it may also be carried out in water if drying is effected after impregnation of the cured product with the hydrogen-abstracting agent.

When the method of this invention is applied for removing surface tack of a photorelief type printing plate, it is preferred to practice the method of this invention simultaneously with or after the post-exposure treatment step for further promoting the vinyl polymerization to impart a sufficient mechanical strength to the printing plate.

In the photorelief type printing plate from which surface tack has been removed according to the method of this invention, the aforementioned troubles attributed to surface tack are not practically caused before, during and after the printing operation. For example, when this photorelief type printing plate is applied to flexographic printing, this printing plate can be handled substantially in the same manner as in the case of the conventional rubber plates from the time just after the printing plate is produced, through the time of the printing operation, to the time of storage of the printing plate after printing. Further, the frequency of the wiping operation during the printing operation is as small as in the case of the conventional rubber plates.

The method of this invention is suitable for removing surface tack of a photocured resin composition, especially a photocured resin composition for a photopolymer type printing plate. Of course, the method of this invention can be applied in fields other than the field of printing. For example, the method of this invention can be effectively applied to removal of surface tack of cured photopolymerized resin compositions as used for paints, coating materials and molded articles. Needless to say, the method of this invention can also be applied to removal of surface tack of heat-polymerized resin compositions.

This invention will now be described in detail by reference to the following Referential Examples, Examples, Comparative Examples and Application Examples in which all of "parts" are given on a weight basis unless otherwise indicated.

REFERENTIAL EXAMPLE 1

300 Parts of a hydroxyl group-terminated hydrogenated 1,2-polybutadiene having 1.6 hydroxyl groups on the average in one molecule (number average molecular weight $\overline{M}n=3,000$, hydrogenation degree=95%) were mixed with 17.4 parts of tolylene diisocyanate (hereinafter referred to as TDI; 2,4-isomer/2,6-isomer ratio=3/2), and they were reacted at 60° C. for 3 hours with stirring. Then, a liquid mixture composed of 8.6 parts of 2-hydroxypropyl methacrylate, 0.1 part of hydroquinone and 0.1 part of dibutyltin dilaurate was added to the reaction mixture, and the reaction was conducted in a dry air atmosphere at 80° C. until a characteristic absorption of NCO ($\lambda$=around 2,260 cm$^{-1}$) was not substantially observed on an infrared absorption spectrum chart, to prepare a prepolymer having a number average molecular weight $\overline{M}n$ of 13,000. To 100 parts of the so obtained prepolymer were added 40 parts of lauryl methacrylate, 10 parts of a methacrylic acid diester of polypropylene glycol having a number average molecular weight $\overline{M}n$ of 400, 3 parts of benzoin amyl ether and 0.1 part of p-methoxyphenol to prepare a photosensitive resin composition.

The number average molecular weight of the hydroxy group-terminated hydrogenated 1,2-polybutadiene was measured using a vapor pressure osmometer (Model 301-A manufactured and sold by Hewlett-Packard Co., U.S.A).

REFERENTIAL EXAMPLE 2

To 200 parts of polyethylene adipate (diol, $\overline{M}n=2,000$) were added 34.8 parts of the same TDI as used in Referential Example 1 and 0.5 part of dibutyltin dilaurate, and the reaction was carried out at 50° C. for 4 hours to obtain a polyethylene adipate having isocyanate groups at both the molecule terminals. To this polyethylene adipate was added 100 parts of polypropylene glycol (diol, $\overline{M}n=2,000$) to obtain an isocyanate group-terminated polyester-polyether block copolymer having a number average molecular weight of 6,500. To 300 parts of the so obtained block copolymer were added 25 parts of 2-hydroxyethyl methacrylate and 0.1 part of hydroquinone, and the reaction was carried out at 70° C. for 2 hours to obtain a prepolymer. To 100 parts of the so obtained prepolymer were added 20 parts of 2-hydroxypropyl methacrylate, 10 parts of styrene, 10 parts of stearyl methacrylate, 1.5 parts of benzoin and 0.2 part of hydroquinone to obtain a photosensitive resin composition.

The number average molecular weight of the polyethylene adipate was determined by the hydroxyl value and the acid value. That of the polypropylene glycol was determined by the hydroxyl value.

REFERENTIAL EXAMPLE 3

To 100 parts of an unsaturated polyester resin (acid value=25) obtained by condensing propylene glycol, ethylene glycol, fumaric acid and adipic acid at a molar ratio of 0.30/0.20/0.25/0.25 were added 20 parts of methacrylic acid, 20 parts of diethylene glycol dimethacrylate, 1 part of benzoin methyl ether and 0.1 part of hydroquinone to obtain a photosensitive resin composition.

REFERENTIAL EXAMPLE 4

To 500 parts of cyclohexane were added 100 parts of a polystyrene-polybutadiene-polystyrene block copolymer (styrene content=about 20% by weight, number average molecular weight $\overline{M}n=76,000$), 0.2 part of p-methoxyphenol, 15 parts of tetraethylene glycol dimethacrylate, 5 parts of trimethylolpropane trimethacrylate, 5 parts of diallyl phthalate and 3 parts of benzoin, and the mixture was agitated under reflux to form a solution. Then, the solution was cast in the form of a sheet and dried, using a ventilation type dryer, at 50° C. for 16 hours. The dried sheet was degassed in vacuo overnight to obtain a solid photosensitive resin composition sheet having a thickness of 2 mm.

The number average molecular weight of the polystyrene-polybutadiene-polystyrene block copolymer was determined by a gel permeation chromatography (GPC) method using, as a standard smaple, a polystyrene manufactured by Pressure Chemical Co., U.S.A. and as an apparatus, WATERS 200 manufactured by Japan-Water Co., Japan.

EXAMPLE 1

The photosensitive resin composition obtained in Referential Example 1 was coated on a 100μ-thick polyester film in a thickness of 2 mm and the coating was covered with a 10μ-thick polyester film to form a laminate sheet. Then, the laminate sheet was exposed for about 6 minutes from the side of the 10μ-thick polyester film to actinic rays from a high pressure mercury lamp placed at a distance of 30 cm from the surface of the laminate sheet, followed by stripping off the polyester films, to obtain a photocured product having a tacky surface. The so obtained photocured product was dipped for 2 minutes in an ethanol solution containing 0.5% by weight of 2-bromo-9,10-anthraquinone, air-dried and irradiated for about 10 minutes with actinic rays having a central wavelength of 254 nm, emitted from Toshiba Germicidal Lamp GL-15 (tradename of a germicidal lamp manufactured and sold by Tokyo Shibaura Electric Company Ltd., Japan) placed at a distance of about 15 cm from the surface of the photocured product, to obtain a photocured product free from surface tack.

EXAMPLE 2

In the same manner as described in Example 1, the photosensitive resin composition obtained in Referential Example 2 was exposed to actinic rays from the high pressure mercury lamp to obtain a photocured product having surface tack. The so obtained photocured product was dipped for 2 minutes in a solution containing 0.5% by weight of benzophenone in water-ethanol (water/ethanol ratio=¼ by weight), and the photocured product was irradiated for about 5 minutes with actinic rays from the same germicidal lamps as used in Example 1, which was placed at a distance of 15 cm from the surface of the photocured product. A photocured product free from surface tack was obtained.

EXAMPLE 3

In the same manner as described in Example 1, the photosensitive resin composition obtained in Referential Example 3 was exposed to actinic rays from the high pressure mercury lamp to obtain a photocured product having surface tack (the surface tack of the so obtained photocured product was slightly lower than the surface tacks of the photocured products obtained by subjecting the photosensitive resin compositions of Referential Examples 1 and 2 to the same exposure treatment). The photocured product was dipped for 1 minute in a solution containing 0.25% by weight of deoxybenzoin in isopropyl alcohol, air-dried and irradiated for 15 minutes with actinic rays having a central wavelength of 254 nm, emitted from Ushio Low Pressure Mercury Lamp ULO-6DQ (tradename of a low pressure mercury lamp manufactured and sold by Ushio Electric Inc., Japan) placed at a distance of about 15 cm from the surface of the photocured product, to obtain a photocured product substantially free from surface tack.

EXAMPLE 4

Both of the surfaces of the photosensitive resin composition obtained in Referential Example 4 were covered with two pieces of a 100μ-thick polyester film so that air bubbles were not formed therebetween. Then, the covered photosensitive composition was exposed to actinic rays from the high pressure mercury lamp in the same manner as described in Example 1 to obtain a photocured product having surface tack. The so obtained photocured product was dipped for 5 minutes in a solution containing 0.5% by weight of 9,10-anthraquinone in ethanol, air-dried and irradiated with actinic rays emitted from the same germicidal lamp as used in Example 1 in the same manner as described in Example 1. A photocured product free from surface tack was obtained.

COMPARATIVE EXAMPLE 1

The photosensitive resin compositions obtained in Referential Examples 1 and 2 were exposed to actinic rays from the high pressure mercury lamp in the same manner as described in Example 1 to obtain photocured products and then post-exposed to actinic rays having a central wavelength of 370 nm, emitted from Toshiba Chemical Lamp FLR-20S/M (tradename of a chemical lamp manufactured and sold by Tokyo Shibaura Electric Company Ltd., Japan) placed at a distance of about 15 cm from the surface of the photocured products, for 30 minutes in a nitrogen atmosphere. The resulting photocured products still had surface tack higher than those of the photocured products obtained in Examples 1 and 2.

COMPARATIVE EXAMPLE 2

Post-exposed photocured products were prepared from the photosensitive resin compositions obtained in Referential Examples 1 and 2 under the same conditions as described in Comparative Example 1 except that the photocured products obtained by exposure of actinic rays from the high pressure mercury lamp were immersed in water and post-exposed instead of post-exposure in a nitrogen atmosphere. The residual surface tack of each of the so post-exposed photocured products was higher than those of the photocured products obtained in Comparative Example 1.

APPLICATION EXAMPLE 1

The photosensitive resin compositions obtained in Referential Examples 1 and 2 were respectively coated on a 100μ-thick polyester film in a thickness of 3 mm and the coatings were covered with a 10μ-thick polypropylene film to form laminate sheets. A negative film was placed on the polypropylene film of each of the laminate sheets. Each of the laminate sheets was exposed for about 2 minutes from the side of the polyester film to actinic rays from the same chemical lamp as used in Comparative Example 1, which was placed at a distance of about 5 cm from the surface of the laminate sheet, and then exposed for about 6 minutes from the side of the negative film to actinic rays from the same chemical lamp placed at a distance of about 20 cm from the surface of the negative film. Then, the so obtained original plate was washed and developed with an aqueous solution of a nonionic surface active agent [a 4% by weight aqueous solution of APR Wash Out Agent W-5 (tradename of a nonionic surface active agent sold by Asahi Kasei Kogyo K.K., Japan) for the original plate obtained from the photosensitive resin composition of Referential Example 1; a 2% by weight aqueous solution of APR Wash Out Agent W-4 (tradename of a nonionic surface active agent sold by Asahi Kasei Kogyo K.K., Japan) for the original plate obtained from the photosensitive resin composition of Referential Example 2] to obtain a relief imaged plate (the relief height being 1.0 mm on the average). Then, the plate was immersed in water and exposed for abour 20 minutes to actinic rays from the same chemical lamp as used in Comparative Example 1, which was placed at a distance of about 15 cm from the surface of the plate (under water post-exposure). Then, the plate was dipped for 2 minutes in a solution containing 0.5% by weight of 2-chloroacetophenone in ethanol and air-dried. The relief surface of the plate was irradiated for 10 minutes with actinic rays from the same germicidal lamp as used in Example 1, which is placed at a distance of about 10 cm from the relief surface, to obtain a printing plate.

Using two kinds of the so obtained printing plates, an unbleached kraft paper was printed. An alcohol based flexographic printing ink (solvent composition: 85 parts of ethanol and 15 parts of isopropyl acetate) was used for the printing plate prepared from the photosensitive resin composition of Referential Example 1, and an aqueous flexographic printing ink (solvent: water=100%) was used for the printing plate prepared from the photosensitive resin composition of Referential Example 2. In each case, adhesion of paper dusts or peeling was not caused during the printing operation, and even after 500,000 sheets of the paper were printed, no surface tack of the printing plate was observed.

APPLICATION EXAMPLE 2

A 100μ-thick polyester film was laminated on one surface of the solid photosensitive resin composition obtained in Referential Example 4 so that air bubbles were not formed therebetween. A negative film was closely contacted with the surface opposite to the polyester film-laminated surface, and actinic ray exposure was conducted under the same conditions as described in Application Example 1 and development was carried out with a mixed solvent of 1,1,1-trichloroethane/isopropyl alcohol (3/1 by weight), followed by drying. A relief imaged plate having a relief height of 0.8 mm on the average was obtained. The so obtained printing plate was exposed for 10 minutes to actinic rays emitted from the same chemical lamp as used in Comparative Example 1, which was placed at a distance of 10 cm from the relief surface of the printing plate, to effect post-exposure. Then, the printing plate was dipped for 2 minutes in a solution containing 0.5% by weight of deoxybenzoin in ethanol and air-dried, and the surface of the printing plate was irradiated with actinic rays from the germicidal lamp under the same conditions as adopted in Application Example 1. Printing on corrugated boards was carried out using the so prepared plate and an aqueous ink (solvent composition: water/ethanol=1/1 by weight). Even after 500,000 boards were printed, any of troubles such as adhesion of paper dusts and peeling was not caused.

COMPARATIVE EXAMPLE 3

Printing plates were prepared in the same manner as described in Application Example 1 except that dipping in the ethanol solution containing 0.5% by weight of 2-chloroacetophenone and irradiation with actinic rays from the germicidal lamp were omitted. Using the so obtained printing plates, the printing operations were carried out under the same conditions as in Application Example 1. In each case, during the printing operation, adhesion of paper dusts and peeling were caused because of surface tack of the printing plate, and therefore, the printing operation had to be interrupted frequently. In the case of the printing plate prepared from the photosensitive resin composition of Referential Example 1, the surface tack was gradually increased as the printing operation was continued.

COMPARATIVE EXAMPLE 4

Printing plates were prepared from the photosensitive resin composition obtained in Referential Examples 1 and 4 in the same manners as described in Application Examples 1 and 2, respectively, except that the surface tack-removing treatment was omitted. Each of the printing plates was dipped for 10 minutes in a surface treating solution formed by diluting Croslene NA-13 (tradename of an NBR latex manufactured and sold by Takeda Chemical Industries Ltd., Japan) having a solid content of 47% by weight with water and adding zinc flower to the diluted latex (NBR solid content=3% by weight, zinc flower content=0.2% by weight) and was heat-treated at about 80° C. for 40 minutes to obtain an NBR-coated printing plate substantially free from surface tack. A high quality paper was printed using each of the so obtained printing plates and an alcohol based ink (solvent composition: 85 parts of ethanol and 15 parts of isopropyl acetate). In each case, in the initial stage, the printing operation could be carried out smoothly without any trouble until about 100,000 sheets of the paper were printed, but, thereafter, adhesion of paper dusts began to be caused, and further, after a while peeling also began to be caused.

REFERENTIAL EXAMPLE 5

A heat-polymerizable resin composition was prepared in the same manner as described in Referential Example 2 except that 2 parts of benzoyl peroxide were used instead of benzoin.

REFERENTIAL EXAMPLE 6

A heat-polymerizable resin composition was prepared in the same manner as described in Referential Example 1 except that 2 parts of azobisisobutyronitrile were used instead of benzoin amyl ether.

EXAMPLE 5

Each of the heat-polymerizable resin compositions obtained in Referential Examples 5 and 6 was cast in a thickness of 2 mm in a space surrounded by 3 mm-spacers on a glass plate, and the cast composition was heated and cured at 80° C. for 1 hour. The cured product was dipped in a solution containing 1% by weight of 2-ethyl-9,10-anthraquinone in ethanol. The dipping time was 1 minute for the cured product prepared from the composition of Referential Example 5 while it was 5 minutes for the cured product prepared from the composition of Referential Example 6. The so dipped cured product was then air-dried and irradiated with actinic rays from the same germicidal lamp as used in Example 1 substantially in the same manner as described in Example 1. The irradiation time was 10 minutes for the cured product prepared from the composition of Referential Example 5 while it was 20 minutes for the cured product prepared from the composition of Referential Example 6. In each case, a cured product free from surface tack was obtained.

EXAMPLE 6

The heat-polymerizable resin composition obtained in Referential Example 6 was coated on a 1 mm-thick paper in a thickness of about 10μ, and heated and cured at 60° C. for 1 hour to obtain a cured film. A solution containing 0.5% by weight of deoxybenzoin in ethanol was sprayed on the cured film, and the film was air-dried and irradiated for 10 minutes with actinic rays from the germicidal lamp substantially in the same manner as in Example 1 to obtain a film free from surface tack.

APPLICATION EXAMPLE 3

The photosensitive resin composition obtained in Referential Example 1 was coated on a 100μ-thick polyester film in a thickness of 3 mm and the coating was covered with a 10μ-thick polypropylene film to form a laminate sheet. A negative film was placed on the polypropylene film of the laminate sheet. The laminate sheet was exposed for about 2 minutes from the side of the polyester film to actinic rays from the same chemical lamp as used in Comparative Example 1, which was placed at a distance of 5 cm from the surface of the laminate sheet, and then exposed for about 5 minutes from the side of the negative film to actinic rays from the same chemical lamp placed at a distance of about 20 cm from the surface of the negative film. Then, the so obtained original plate was washed and developed with an aqueous solution containing 4% by weight of APR Wash Out Agent W-5 (tradename of a nonionic surface active agent sold by Asahi Kasei Kogyo K.K., Japan) to obtain a relief imaged plate (the relief height being 1.0 mm on the average). The plate was washed with water and then dipped for 3 minutes in a solution containing 1% by weight of 2-ethyl-9,10-anthraquinone in ethanol/acetone (9/1 by weight), followed by air-drying. Then, the plate was immersed in water, and exposed to actinic rays from the same chemical lamp as used in Comparative Example 1 and substantially simultaneously irradiated with actinic rays from Toshiba Germicidal Lamp GL-30 (tradename of a germicidal lamp manufactured and sold by Tokyo Shibaura Electric Company Ltd., Japan) placed perpendicularly to and just under the chemical lamp in a crosswise manner and placed at a distance of about 15 cm from the surface of the plate to effect under water post-exposure and irradiation according to this invention (post-exposure with the chemical lamp: for 20 minutes, irradiation with the germicidal lamp: for 10 minutes). The plate was then dried at around 40° C. for 10 minutes. A printing plate free from surface tack was obtained.

EXAMPLE 7

The photosensitive resin composition obtained in Referential Example 1 was coated on a 100μ-thick polyester film in a thickness of 2 mm and the coating was covered with a 10μ-thick polyester film to form a laminate sheet. The laminate sheet was exposed for 20 minutes from the side of the 10μ-thick polyester film to actinic rays from the same chemical lamp as used in Comparative Example 1, which was placed at a distance of about 15 cm from the surface of the laminate sheet, followed by stripping off the polyester films. A photocured product having a considerable surface tack was obtained. The photocured product was dipped for 2 minutes in a solution containing 0.2% by weight of benzophenone and 0.3% by weight of acetophenone in isopropyl alcohol, followed by air-drying. The so treated photocured product was irradiated for 5 minutes with actinic rays from a 2,000 W mercury lamp (manufactured and sold by Orc Manufacturing Co., Ltd., Japan) having an intensity distribution of about 16%, relative to the entire intensity distribution, in the region of from 200 to 300 nm, which lamp was placed at a distance of about 55 cm from the surface of the photocured product. A photocured product substantially free from surface tack was obtained.

What is claimed is:

1. A method of removing surface tack of a cured free radical polymerized resin composition which comprises impregnating the surface layer of the cured free radical polymerized resin composition with at least one organic carbonyl compound capable of abstracting a hydrogen atom out of other compounds under irradiation with actinic rays, and irradiating the impregnated layer of the cured resin composition with actinic rays having wavelengths of from 200 to 300 nm.

2. A method according to claim 1, wherein the cured free radical polymerized resin composition is a cured photopolymerized resin composition.

3. A method according to claim 2, wherein the cured photopolymerized resin composition is in the form of a printing plate.

4. A method according to claim 1, wherein the organic carbonyl compound has at least one unsubstituted or substituted aryl group bonded to the carbon atom of the carbonyl group.

5. A method according to claim 4, wherein said unsubstituted or substituted aryl group is a phenyl or naphthyl group unsubstituted or substituted with one phenyl group or with one or two member selected from the group consisting of halogen atoms, a hydroxyl group, a carboxyl group, a nitro group, straight chain or branched alkyl groups having 1 to 5 carbon atoms and straight chain or branched alkoxyl groups having 1 to 5 carbon atoms.

6. A method according to claim 5, wherein the organic carbonyl compound is at least one member selected from the group consisting of compounds represented by the following formula (I):

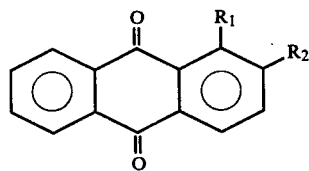

wherein
$R_1$ and $R_2$, which may be the same or different, stand for a hydrogen atom, a nitro group, a carboxyl group, a straight chain or branched alkyl group having 1 to 5 carbon atoms or a halogen atom selected from F, Cl, Br and I,
and compounds represented by the following formula (II):

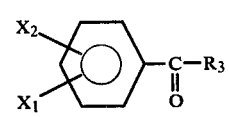

wherein
$X_1$ and $X_2$, which may be the same or different, stand for a halogen atom selected from F, Cl, Br and I, a hydrogen atom, a nitro group, a straight chain or branched alkoxyl group having 1 to 5 carbon atoms, a hydroxyl group or a straight chain or branched alkyl group having 1 to 5 carbon atoms, and $R_3$ is a member selected from the group consisting of straight chain or branched alkyl groups having 1 to 5 carbon atoms, a naphthyl group, groups represented by the following formula:

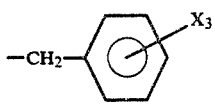

wherein $X_3$ stands for a halogen atom selected from F, Cl, Br and I, a hydrogen atom, a straight chain or branched alkyl group having 1 to 5 carbon atoms or a straight chain or branched alkoxyl group having 1 to 5 carbon atoms, or a phenyl group, groups represented by the following formula:

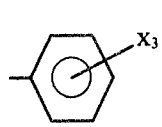

wherein $X_3$ is as defined above, and groups represented by the following formula:

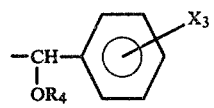

wherein $X_3$ is as defined above and $R_4$ is a hydrogen atom or a straight chain or branched alkyl group having 1 to 5 carbon atoms.

7. A method according to claim 1, wherein the cured free radical polymerized resin composition comprises a prepolymer having two or less polymerizable double bonds.

8. A method according to claim 3, which is conducted after or simultaneously with the step of post-exposure treatment of the photopolymer type printing plate.

* * * * *